(12) United States Patent
Jeon et al.

(10) Patent No.: US 9,214,517 B2
(45) Date of Patent: Dec. 15, 2015

(54) SEMICONDUCTOR DEVICE USING 2-DIMENSIONAL ELECTRON GAS AND 2-DIMENSIONAL HOLE GAS AND METHOD OF MANUFACTURING THE SEMICONDUCTOR DEVICE

(71) Applicant: Samsung Electronics Co., Ltd., Suwon-Si, Gyeonggi-Do (KR)

(72) Inventors: Woo-chul Jeon, Daegu (KR); Jai-kwang Shin, Anyang-si (KR); Jae-joon Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/860,153

(22) Filed: Apr. 10, 2013

(65) Prior Publication Data

US 2014/0091310 A1  Apr. 3, 2014

(30) Foreign Application Priority Data

Sep. 28, 2012 (KR) .......... 10-2012-0109276

(51) Int. Cl.
*H01L 29/15* (2006.01)
*H01L 29/20* (2006.01)
(Continued)

(52) U.S. Cl.
CPC ........ *H01L 29/2003* (2013.01); *H01L 21/8252* (2013.01); *H01L 27/0605* (2013.01);
(Continued)

(58) Field of Classification Search
CPC .................................. H01L 29/2003
USPC ........................... 257/192–196, 76
See application file for complete search history.

(56) References Cited

U.S. PATENT DOCUMENTS 4,830,980 A * 5/1989 Hsieh ............................ 438/169
4,974,038 A  11/1990 Delagebeaudeuf et al.
(Continued)

FOREIGN PATENT DOCUMENTS

JP        4956155 B2    6/2012
KR    2011-0099546 A    9/2011
WO   WO-2012/013943 A1  2/2012

OTHER PUBLICATIONS

Teke, "Springer Handbook of Electrical and Photonic Materials", ISBN: 978-0-387-26059-4, p. 791.*

*Primary Examiner* — Cheung Lee
*Assistant Examiner* — Frederick B Hargrove
(74) *Attorney, Agent, or Firm* — Harness, Dickey & Pierce, P.L.C.

(57) ABSTRACT

A semiconductor device includes a first compound semiconductor layer on a substrate, first through third electrodes spaced apart from each other on the first compound semiconductor layer, a second compound semiconductor layer on the first compound semiconductor layer between the first through third electrodes, a third compound semiconductor layer on the second compound semiconductor layer between the first and second electrodes, a first gate electrode on the third compound semiconductor layer, a fourth compound semiconductor layer having a smaller thickness than the third compound semiconductor layer on a portion of the second compound semiconductor layer between the second and third electrodes, and a second gate electrode on the fourth compound semiconductor layer. The first compound semiconductor layer between the second and third electrodes includes a 2-dimensional electron gas (2DEG) and the third compound semiconductor layer includes a 2-dimensional hole gas (2DHG).

6 Claims, 7 Drawing Sheets

(51) Int. Cl.
*H01L 21/8252* (2006.01)
*H01L 27/06* (2006.01)
*H01L 29/66* (2006.01)
*H01L 29/778* (2006.01)
*H01L 27/085* (2006.01)
*H01L 29/417* (2006.01)
*H01L 29/10* (2006.01)

(52) U.S. Cl.
CPC ........ *H01L27/085* (2013.01); *H01L 29/66462* (2013.01); *H01L 29/7781* (2013.01); *H01L 29/7786* (2013.01); *H01L 29/1066* (2013.01); *H01L 29/41766* (2013.01)

(56) References Cited

U.S. PATENT DOCUMENTS

| 5,302,840 | A | * | 4/1994 | Takikawa | 257/194 |
| 6,190,975 | B1 | * | 2/2001 | Kubo et al. | 438/285 |
| 7,786,511 | B2 | | 8/2010 | Ishida | |
| 7,816,707 | B2 | | 10/2010 | Hikita et al. | |
| 2009/0065810 | A1 | * | 3/2009 | Honea et al. | 257/192 |
| 2010/0019279 | A1 | * | 1/2010 | Chen et al. | 257/194 |
| 2011/0121314 | A1 | * | 5/2011 | Suh et al. | 257/76 |
| 2013/0221409 | A1 | * | 8/2013 | Nakajima et al. | 257/194 |

* cited by examiner

SEMICONDUCTOR DEVICE USING 2-DIMENSIONAL ELECTRON GAS AND 2-DIMENSIONAL HOLE GAS AND METHOD OF MANUFACTURING THE SEMICONDUCTOR DEVICE

CROSS-REFERENCE TO RELATED APPLICATIONS

This application claims the benefit of Korean Patent Application No. 10-2012-0109276, filed on Sep. 28, 2012, in the Korean Intellectual Property Office, the disclosure of which is incorporated herein in its entirety by reference.

BACKGROUND

1. Field

Example embodiments relate to semiconductor devices, and more particularly, to semiconductor devices using a 2-dimensional electron gas (2DEG) and a 2-dimensional hole gas (2DHG), and methods of manufacturing the semiconductor devices.

2. Description of the Related Art

A gallium nitride (GaN)-based power device is one of the prime candidates for replacing a general silicon radio frequency (RF) and power device. The GaN-based power device may be used as an RF power amplifier or a switching device. When used as a switching device, the GaN-based power device may be used to drive various motors, and may be used to control a current flow in a power conversion system that converts an alternating current (AC) to a direct current (DC), DC to AC, or DC to DC. Accordingly, efficiencies of RF and power conversion systems may be dependent upon efficiencies of amplifying and switching devices.

A switching device that is currently used is a power metal oxide semiconductor field effect transistor (MOSFET) or an insulated gate bipolar transistor (IGBT) using silicon. Thus, an increase in the efficiency of the switching device may be limited due to the limitation of silicon as a material.

Accordingly, there have been attempts to increase a conversion efficiency by manufacturing a transistor using a GaN semiconductor. However, it is not only difficult to manufacture a bulk GaN wafer but there is also a limit to a size of a substrate. Thus, a method of growing a GaN layer on a silicon substrate is currently used.

A GaN switch that is mostly used is an n-type device that is manufactured via n-type device epitaxial growth. Accordingly, it is difficult to form an n-type GaN switch and a p-type GaN switch on the same substrate, and thus, it is difficult to highly integrate a semiconductor device and an application range of the semiconductor device may be limited.

SUMMARY

Example embodiments provide semiconductor devices using a 2-dimensional electron gas (2DEG) and a 2-dimensional hole gas (2DHG), which have relatively high integration and relatively wide application ranges. Example embodiments also provide methods of manufacturing the semiconductor devices.

Additional aspects will be set forth in part in the description which follows and, in part, will be apparent from the description, or may be learned by practice of example embodiments.

According to example embodiments, a semiconductor device may include a first compound semiconductor layer on a substrate, first through third electrodes on the first compound semiconductor layer, the first through third electrodes spaced apart from each other and the first compound semiconductor layer between the second and third electrodes including a 2-dimensional electron gas (2DEG), a second compound semiconductor layer on the first compound semiconductor layer between the first through third electrodes, the second compound semiconductor layer having a higher band gap than the first compound semiconductor layer, a third compound semiconductor layer on the second compound semiconductor layer between the first and second electrodes, the third compound semiconductor layer including a 2-dimensional hole gas (2DHG), a first gate electrode on the third compound semiconductor layer, a fourth compound semiconductor layer on a part of the second compound semiconductor layer between the second and third electrodes, the fourth compound semiconductor layer having a smaller thickness than the third compound semiconductor layer, and a second gate electrode on the fourth compound semiconductor layer, the second gate electrode connected to the first gate electrode through a first wire.

A second wire may connect the first and third electrodes. Band gaps of the third and fourth compound semiconductor layers may be smaller than the band gap of the second compound semiconductor layer. The third and fourth compound semiconductor layers may be formed of one of same and different compound semiconductors. The third and fourth compound semiconductor layers may include p-gallium nitride (GaN) layers. The first compound semiconductor layer may include a Group III-V compound semiconductor layer.

According to example embodiments, a semiconductor device may include an n-type switching device on a substrate, the n-type switching device including a first gate and a 2-dimensional electron gas (2DEG) as a channel carrier, and a p-type switching device on the substrate, the p-type switching device including a second gate and a 2-dimensional hole gas (2DHG) as a channel carrier, wherein the n- and p-type switching devices include a common electrode, and the first and second gates of the n- and p-type switching devices are connected to each other through a first wire.

A drain of the n-type switching device and a drain of the p-type switching device may be connected to each other through a second wire. The p-type switching device may be a freewheeling diode (FRD).

The n-type switching device may include first and second compound semiconductor layers sequentially stacked on the substrate, a fourth compound semiconductor layer on a portion of the second compound semiconductor layer, the first gate on the fourth compound semiconductor layer, and source and drain electrodes on the first compound semiconductor layer, the source and drain electrodes spaced apart from the first gate and the fourth compound semiconductor layer. A band gap of the second compound semiconductor layer may be higher than band gaps of the first and fourth compound semiconductor layers, and the 2DEG may be included in the first compound semiconductor layer around the fourth compound semiconductor layer.

The p-type switching device may include first through third compound semiconductor layers sequentially stacked on the substrate, the second gate on the third compound semiconductor layer, and source and drain electrodes on the first compound semiconductor layer and contacting the second and third compound semiconductor layers. A band gap of the second compound semiconductor layer may be higher than band gaps of the first and third compound semiconductor layers, and the 2DHG may be included in the third compound semiconductor layer.

According to example embodiments, a method of manufacturing a semiconductor device may include sequentially forming a first compound semiconductor layer, a second compound semiconductor layer and a preliminary compound semiconductor layer on a substrate, the preliminary compound semiconductor layer formed to a thickness at which a 2-dimensional hole gas (2DHG) is shown, sequentially patterning the preliminary compound semiconductor layer and the second compound semiconductor layer to expose first through third regions of the first compound semiconductor layer, the first through third regions being separate from each other, forming first through third electrodes respectively on the first through third regions, forming third and fourth compound semiconductor layers by decreasing a thickness of one of a region of the preliminary compound semiconductor layer between the first and second electrodes and a region of the preliminary compound semiconductor layer between the second and third electrodes, the third compound semiconductor layer having a greater thickness than the fourth compound semiconductor layer, forming a 2-dimensional electron gas (2DEG) in the first compound semiconductor layer by removing a portion of the fourth compound semiconductor layer, forming first and second gate electrodes respectively on the third and fourth compound semiconductor layers, and connecting the first and second gate electrodes through a first wire.

The second electrode may be between the first and second gate electrodes, and the method may further include connecting the first and third electrodes through a second wire. Connecting the first and second gate electrodes may include forming a first interlayer insulation layer covering the first through third electrodes, the third and fourth compound semiconductor layers, and the first and second gate electrodes, forming first and second contact holes in the first interlayer insulation layer, the first contact hole partially exposing the first gate electrode and the second contact hole partially exposing the second gate electrode, forming a conductive film filling the first and second contact holes in the first interlayer insulation layer, and patterning the conductive film into the first wire.

Connecting the first and third electrodes may include forming a second interlayer insulation layer covering the first interlayer insulation layer and the first wire, forming third and fourth contact holes in the first and second interlayer insulation layers, the third contact hole partially exposing the first electrode and the fourth contact hole partially exposing the third electrode, and forming the second wire filing the third and fourth contact holes in the first and second interlayer insulation layers.

According to example embodiments, a method of forming a semiconductor device may include sequentially forming a first compound semiconductor layer, a second compound semiconductor layer, and a preliminary compound semiconductor layer on a substrate, the preliminary compound semiconductor layer formed to a thickness at which a 2-dimensional hole gas (2DHG) is shown, decreasing a thickness of a portion of the preliminary compound semiconductor layer, forming third and fourth compound semiconductor layers by separating the portion of the preliminary compound semiconductor layer having the decreased thickness from another portion of the preliminary compound semiconductor layer having a greater thickness, the forming the third and fourth compound semiconductor layers exposing first through third regions of the first compound semiconductor layer, the first through third regions being separate from each other, forming first through third electrodes respectively on the first through third regions, forming a 2-dimensional electron gas (2DEG) in the first compound semiconductor layer by removing a portion of the fourth compound semiconductor layer, forming first and second gate electrodes respectively on the third and fourth compound semiconductor layers, and connecting the first and second gate electrodes through a first wire.

The second electrode may be between the first and second gate electrodes, and the method may further include connecting the first and third electrodes through a second wire. Connecting the first and second gate electrodes may include forming a first interlayer insulation layer covering the first through third electrodes, the third and fourth compound semiconductor layers, and the first and second gate electrodes, forming first and second contact holes in the first interlayer insulation layer, the first contact hole partially exposing the first gate electrode and the second contact hole partially exposing the second gate electrode, forming a conductive film filling the first and second contact holes in the first interlayer insulation layer, and patterning the conductive film into the first wire.

Connecting the first and third electrodes may include forming a second interlayer insulation layer covering the first interlayer insulation layer and the first wire, forming third and fourth contact holes in the first and second interlayer insulation layers, the third contact hole partially exposing the first electrode and the fourth contact hole partially exposing the third electrode, and forming the second wire filing the third and fourth contact holes in the first and second interlayer insulation layers.

According to example embodiments, a method of manufacturing a semiconductor device may include forming a first compound semiconductor layer on a substrate, forming first through third electrodes on the first compound semiconductor layer, the first through third electrodes spaced apart from each other, sequentially forming a second compound semiconductor layer and a third compound semiconductor layer on the first compound semiconductor layer between the first and second electrodes, and sequentially forming the second compound semiconductor layer and a fourth compound semiconductor layer on the first compound semiconductor layer between the second and third electrodes, the third and fourth compound semiconductor layers formed to a thickness at which a 2-dimensional hole gas (2DHG) is shown, decreasing a thickness of one of the third and fourth compound semiconductor layers, forming a 2-dimensional electron gas (2DEG) in the first compound semiconductor layer by removing a portion of the one of the third and fourth compound semiconductor layers having the decreased thickness, after the decreasing the thickness, forming first and second gate electrodes respectively on the third and fourth compound semiconductor layers, and connecting the first and second gate electrodes through a first wire.

The second electrode may be between the first and second gate electrodes, and the method may further include connecting the first and third electrodes through a second wire.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
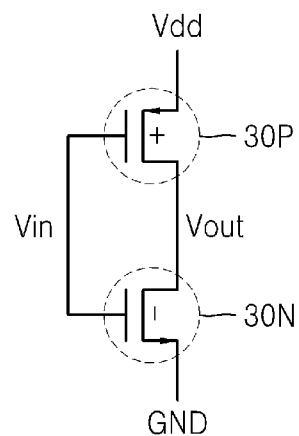
FIG. 1 is an equivalent circuit of a semiconductor device using a 2-dimensional electron gas (2DEG) and a 2-dimensional hole gas (2DHG), according to example embodiments.

Reference will now be made in detail to embodiments, examples of which are illustrated in the accompanying drawings, wherein like reference numerals refer to like elements throughout and thicknesses of layers or regions are exaggerated for clarity. Also, the embodiments described below are merely examples, and various modifications are possible from the embodiments. It will be understood that when an element is referred to as being "above" or "on" another element, it may be directly on the other element or intervening elements may also be present. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

First, a semiconductor device using a 2-dimensional electron gas (2DEG) and a 2-dimensional hole gas (2DHG), according to example embodiments, will be described.

FIG. 1 is an equivalent circuit of a semiconductor device using 2DEG and 2DHG, according to example embodiments. Referring to FIG. 1, the semiconductor device according to example embodiments may include a first switching device 30P and a second switching device 30N. The first switching device 30P may be a p-type switching device, and the second switching device 30N may be an n-type switching device. The first switching device 30P may be a power device using 2DHG as a channel carrier. In the first switching device 30P, "+" denotes that 2DHG is used as a channel carrier. The second switching device 30N may be a power device using 2DEG as a channel carrier.

In the second switching device 30N, "−" denotes that 2DEG is used as a channel carrier. Gates of the first and second switching devices 30P and 30N are connected through a common wire. A voltage is applied to the gates through the common wire. Also, terminals of the first and second switching devices 30P and 30N, which face each other, are connected through a common wire. Such a common wire is an output voltage (Vout) wire. A drain of the first switching device 30P is connected to Vdd. A source of the second switching device 30N is grounded (GND). The equivalent circuit shown in FIG. 1 shows a complementary metal oxide semiconductor (CMOS) inverter.

Figure 2:
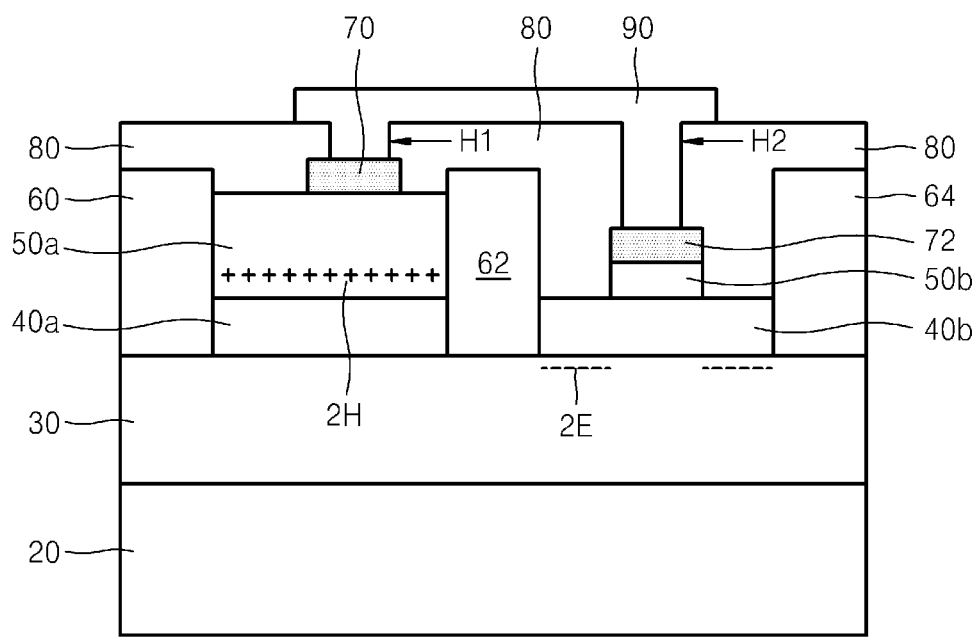
FIG. 2 is a cross-sectional view of the semiconductor device of FIG. 1.

FIG. 2 is a cross-sectional view of the semiconductor device of FIG. 1. Referring to FIG. 2, a first compound semiconductor layer 30 may be disposed on a substrate 20. The substrate 20 may be a silicon substrate. The first compound semiconductor layer 30 may include a Group III-V compound semiconductor, for example, a gallium nitride (GaN) layer. First through third electrodes 60, 62, and 64 may be on the first compound semiconductor layer 30. The first through third electrodes 60, 62, and 64 may be spaced apart from each other. The first through third electrodes 60, 62, and 64 may each be a source or drain electrode. Alternatively, the second electrode 62 may be a common electrode. Accordingly, the second electrode 62 may be used as a source electrode or a drain electrode.

Second compound semiconductor layers 40a and 40b are on the first compound semiconductor layer 30 between the first through third electrodes 60 through 64. The second compound semiconductor layers 40a and 40b cover an entire top surface of the first compound semiconductor layer 30 between the first through third electrodes 60, 62 and 64. The polarizability or band gap of the second compound semiconductor layers 40a and 40b may be higher than that of the first compound semiconductor layer 30. The second compound semiconductor layers 40a and 40b may include a Group III-V compound semiconductor. For example, the second compound semiconductor layers 40a and 40b may include an aluminum gallium nitride (AlGaN) layer.

A third compound semiconductor layer 50a is on the second compound semiconductor layer 40a between the first and second electrodes 60 and 62. The third compound semiconductor layer 50a covers an entire top surface of the second compound semiconductor layer 40a. The polarizability or band gap of the third compound semiconductor layer 50a may be smaller than that of the second compound semiconductor layer 40a. The third compound semiconductor layer 50a may include a p-type Group III-V compound semiconductor layer. For example, the third compound semiconductor layer 50a may include a p-GaN layer.

Due to a difference between band gaps of the second compound semiconductor layer 40a and the first compound semiconductor layer 30, 2DEG may be seen in a part of the first compound semiconductor layer 30 below the second compound semiconductor layer 40a. However, 2DEG is offset as the third compound semiconductor layer 50a is provided on the second compound semiconductor layer 40a. When the third compound semiconductor layer 50a has a predetermined or given thickness or more, 2DHG 2H is shown in the third compound semiconductor layer 50a. The 2DHG 2H may be on a bottom surface of the third compound semiconductor layer 50a facing a top surface of the second compound semiconductor layer 40a. The 2DHG 2H may be used as a channel carrier of a p-type switching device.

A fourth compound semiconductor layer 50b is on the second compound semiconductor layer 40b between the second and third electrodes 62 and 64. The fourth compound semiconductor layer 50b may be formed on a part of the second compound semiconductor layer 40b. The fourth compound semiconductor layer 50b is spaced apart from the second and third electrodes 62 and 64. The polarizability or band gap of the fourth compound semiconductor layer 50b may be smaller than that of the second compound semiconductor layer 40b. The fourth compound semiconductor layer 50b and the third compound semiconductor layer 50a may be formed of the same or different compound semiconductors.

A thickness of the fourth compound semiconductor layer 50b may be thinner than a thickness of the third compound semiconductor layer 50a. The thickness of the fourth compound semiconductor layer 50b may be thinner than a thickness of 2DHG in the fourth compound semiconductor layer 50b. Accordingly, 2DHG is not shown in the fourth compound semiconductor layer 50b. Due to the inclusion of the fourth compound semiconductor layer 50b, 2DEG may not be shown in a region of the first compound semiconductor layer 30 below the fourth compound semiconductor layer 50b, or even if 2DEG is shown in the region, the density of the 2DEG may be remarkably lower than other regions. Accordingly, the region of the first compound semiconductor layer 30 below the fourth compound semiconductor layer 50b may be a depletion region. 2DEG 2E is shown in regions of the first compound semiconductor layer 30 between the second electrode 62 and the fourth compound semiconductor layer 50b and between the third electrode 64 and the fourth compound semiconductor layer 50b. The 2DEG 2E may be used as a channel carrier of an n-type switching device.

A first gate electrode 70 may be formed on the third compound semiconductor layer 50a, and a second gate electrode 72 may be formed on the fourth compound semiconductor layer 50b. The first gate electrode 70 is spaced apart from the first and second electrodes 60 and 62. The second gate electrode 72 is spaced apart from the second and third electrodes 62 and 64. The first and second gate electrodes 70 and 72 are connected to each other through a first wire 90. The first wire 90 is a common wire. Voltages having the same size may be simultaneously applied to the first and second gate electrodes 70 and 72 through the first wire 90.

An interlayer insulation layer 80 is between the first wire 90 and the first through third electrodes 60 through 64. The interlayer insulation layer 80 is also between the first and second electrodes 60 and 62 and the first gate electrode 70. The interlayer insulation layer 80 is also between the second and third electrodes 62 and 64 and the second gate electrode 72. The interlayer insulation layer 80 covers an exposed top surface of the second compound semiconductor layer 40b by filling spaces between the second and third electrodes 62 and 64 and the fourth compound semiconductor layer 50b.

The interlayer insulation layer 80 also covers a top surface of the third compound semiconductor layer 50a around the first gate electrode 70. The first wire 90 is connected to the first and second gate electrodes 70 and 72 by filling a first contact hole H1 exposing the first gate electrode 70 and a second contact hole H2 exposing the second gate electrode 72, which are formed in the interlayer insulation layer 80. The first wire 90 may be formed on the interlayer insulation layer 80.

In FIG. 2, the substrate 20, the first compound semiconductor layer 30, the second compound semiconductor layer 40a, the third compound semiconductor layer 50a, the first electrode 60, the second electrode 62, and the first gate electrode 70 may form a p-type switching device, for example, a p-type power field effect transistor (FET).

Also, in FIG. 2, the substrate 20, the first compound semiconductor layer 30, the second compound semiconductor layer 40b, the fourth compound semiconductor layer 50b, the second electrode 62, the third electrode 64, and the second gate electrode 72 may form an n-type switching device, for example, an n-type power FET.

As such, both an n-type power FET and a p-type power FET are disposed on one substrate 20, and thus integration of the semiconductor device may be increased and the semiconductor device may be applied in various fields.

Figure 3:
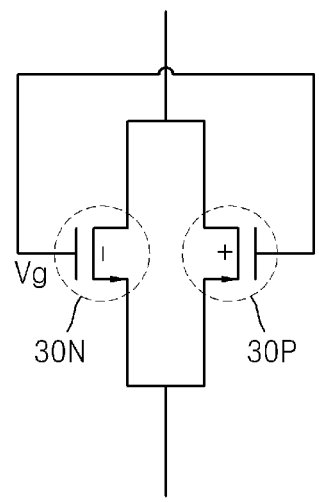
FIG. 3 is an equivalent circuit of a semiconductor device using 2DEG and 2DHG, according to example embodiments.

FIG. 3 is an equivalent circuit of a semiconductor device using 2DEG and 2DHG, according to example embodiments. Referring to FIG. 3, the semiconductor device according to example embodiments may include the first switching device 30P and the second switching device 30N. The first and second switching devices 30P and 30N may be identical to those described above with reference to FIG. 1. The gates of the first and second switching devices 30P and 30N are connected to each other through a common wire. A gate voltage Vg is applied to the common wire. The drains of the first and second switching devices 30P and 30N are connected to each other. Sources of the first and second switching devices 30P and 30N are also connected to each other.

Figure 4:
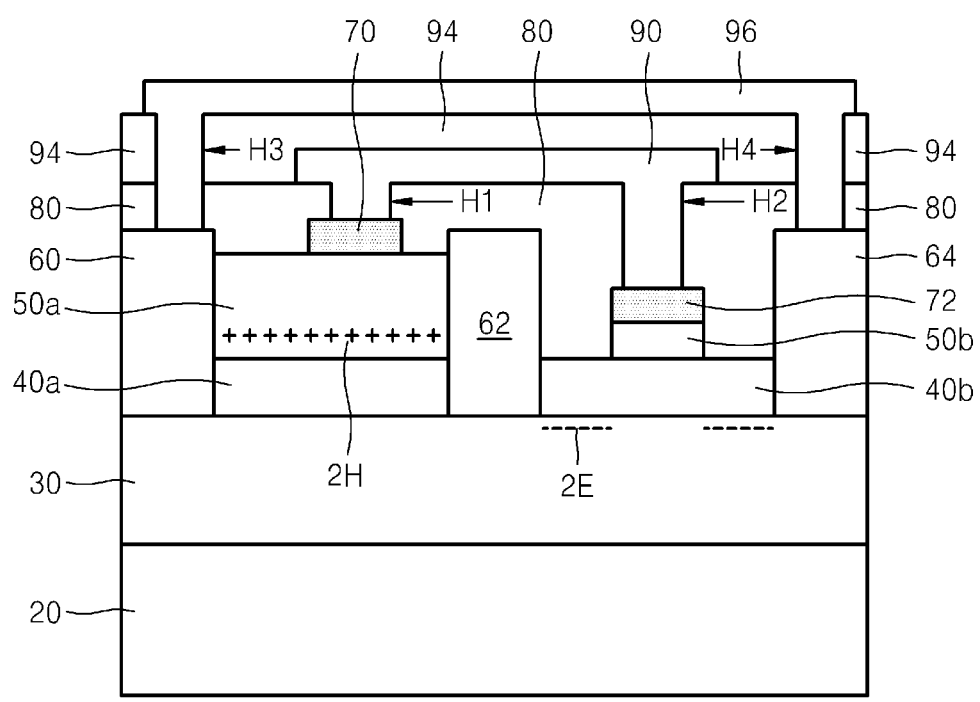
FIG. 4 is a cross-sectional view of the semiconductor device of FIG. 3.

FIG. 4 is a cross-sectional view of the semiconductor device of FIG. 3. Referring to FIG. 4, the semiconductor device of FIG. 3 is similar to that of FIG. 2. Accordingly, only differences between the semiconductor devices of FIGS. 2 and 3 are described, and the same reference numerals denote the same elements.

A second interlayer insulation layer 94 covering the first wire 90 is on the interlayer insulation layer (hereinafter, referred to as the first interlayer insulation layer) 80. A third contact hole H3 exposing a top surface of the first electrode 60 and a fourth contact hole H4 exposing a top surface of the third electrode 64 are formed in an interlayer insulation layer consisting of the first and second interlayer insulation layers 80 and 94. A second wire 96 filling the third and fourth contact holes H3 and H4 may be formed on the second interlayer insulation layer 94. The second wire 96 may be a metal wire or an ohmic contact wire. The first and third electrodes 60 and 64 are connected to each other through the second wire 96.

Figure 5:
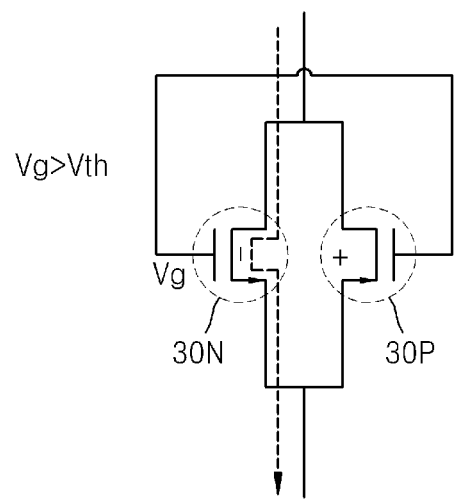
FIG. 5 is a circuit illustrating a flow of a current when a voltage applied to a gate of the semiconductor device of FIG. 4 is higher than a threshold voltage.
Figure 6:
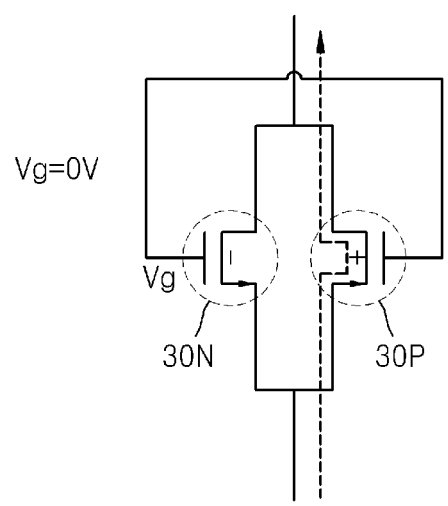
FIG. 6 is a circuit illustrating a flow of a current when a voltage applied to a gate of the semiconductor device of FIG. 4 is an overvoltage (OV)

FIGS. 5 and 6 show flow of currents during operations of the semiconductor device of FIG. 4 by using the equivalent circuit of FIG. 3.

When the gate voltage Vg applied to the first and second gate electrodes 70 and 72 through the first wire 90 connecting the first and second gate electrodes 70 and 72 is higher than a threshold voltage, the first switching device 30P that is a p-type device is turned off. Accordingly, as shown in FIG. 5, a current (dashed line) flows through the second switching device 30N that is an n-type device. The threshold voltage is a threshold voltage of the second switching device 30N.

When the gate voltage Vg applied through the first wire 90 is 0 V, the second switching device 30N is turned off, the current (dashed line) flows through the first switching device 30P in an opposite direction of FIG. 5, as shown in FIG. 6.

As such, in the semiconductor device of FIG. 4, because the first switching device 30P operates as a freewheeling diode (FRD), the semiconductor device of FIG. 4 may be used as a power device controlling a bi-directional current flow.

A method of manufacturing a semiconductor device using 2DEG and 2DHG, according to example embodiments, will now be described with reference to FIGS. 7 through 13. Here, the same reference numerals denote the same elements described above, and descriptions thereof are not repeated herein.

Figure 7:
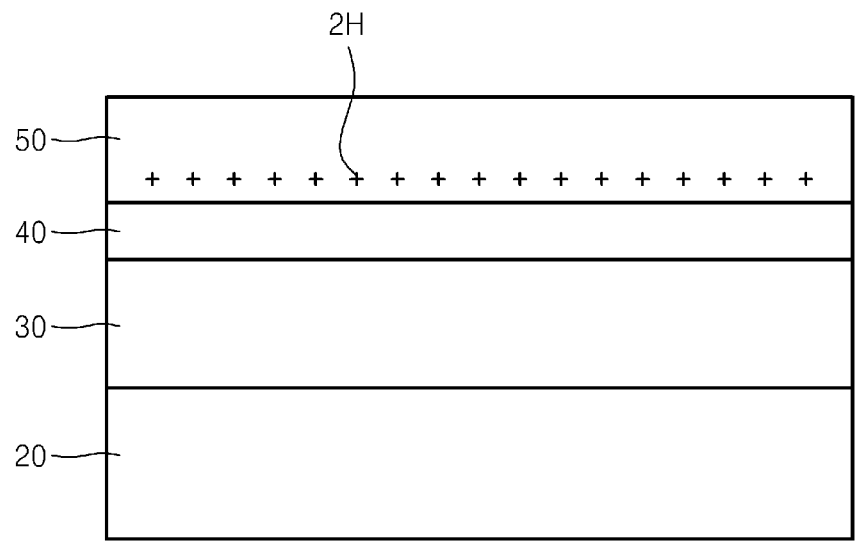
FIGS. 7 through 13 are cross-sectional views for describing a method of manufacturing a semiconductor device using 2DEG and 2DHG, according to example embodiments.

Referring to FIG. 7, the first compound semiconductor layer 30 may be formed on the substrate 20. A second compound semiconductor layer 40 may be formed on the first compound semiconductor layer 30. A preliminary compound semiconductor layer 50 may be formed on the second compound semiconductor layer 40. Like the first compound semiconductor layer 30, the other compound semiconductor layer 50 may have a smaller polarization or band gap than the second compound semiconductor layer 40. The other compound semiconductor layer 50 may include a p-type Group III-V compound semiconductor layer, and for example, the other compound semiconductor layer 50 may include a p-GaN layer.

2DEG (not shown) is shown in the first compound semiconductor layer 30 as the second compound semiconductor layer 40 is formed, but the 2DEG disappears as the other compound semiconductor layer 50 is formed, and rather, 2DHG 2H is shown in the other compound semiconductor layer 50 due to a difference between band gaps of the other compound semiconductor layer 50 and the second compound semiconductor layer 40. The 2DHG 2H is shown near an interface between the second compound semiconductor layer 40 and the other compound semiconductor layer 50. As described above, the other compound semiconductor layer 50 may have a thickness that offsets 2DEG and shows the 2DHG 2H. For example, the thickness of the other compound semiconductor layer 50 may be higher than 0 μm and lower than or equal to 1 μm, or may be higher than 1 μm if required. The first and second compound semiconductor layers 30 and 40 and the other compound semiconductor layer 50 may be formed via an epitaxial growth method.

Figure 8:
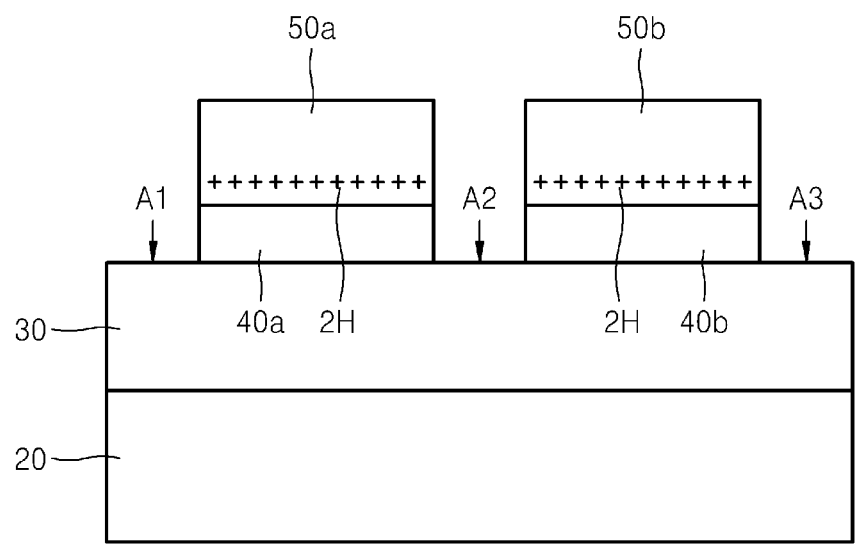

Continuously, the other compound semiconductor layer 50 and the second compound semiconductor layer 40 may be sequentially etched and patterned while masking a part of the other compound semiconductor layer 50. As a result, as shown in FIG. 8, the second compound semiconductor layers 40a and 40b that are spaced apart from each other are formed on the first compound semiconductor layer 30, the third compound semiconductor layer 50a may be formed on the second compound semiconductor layer 40a, and the fourth compound semiconductor layer 50b may be formed on the second compound semiconductor layer 40b. The third and fourth compound semiconductor layers 50a and 50b are obtained as a result of etching the other compound semiconductor layer 50. A part of the first compound semiconductor layer 30 is exposed between the second compound semiconductor layers 40a and 40b that are spaced apart from each other. According to the patterning, first through third regions A1 through A3 of the first compound semiconductor layer 30, which are separate from each other, are exposed.

Figure 9:
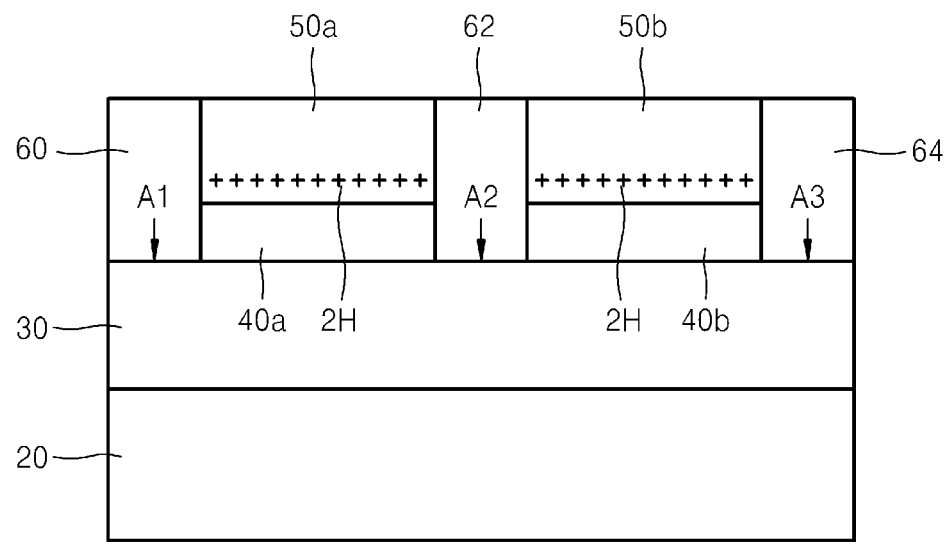

Referring to FIG. 9, the first through third electrodes 60 through 64 are respectively formed on the exposed first through third regions A1 through A3 of the first compound semiconductor layer 30. The first through third electrodes 60 through 64 may each be a metal electrode or an ohmic contact electrode. The first through third electrodes 60 through 64 are spaced apart from each other. The first electrode 60 is disposed on the left of the second compound semiconductor layer 40a, the second electrode 62 is disposed between the second compound semiconductor layers 40a and 40b, and the third electrode 64 is disposed on the right of the second compound semiconductor layer 40b.

Figure 10:
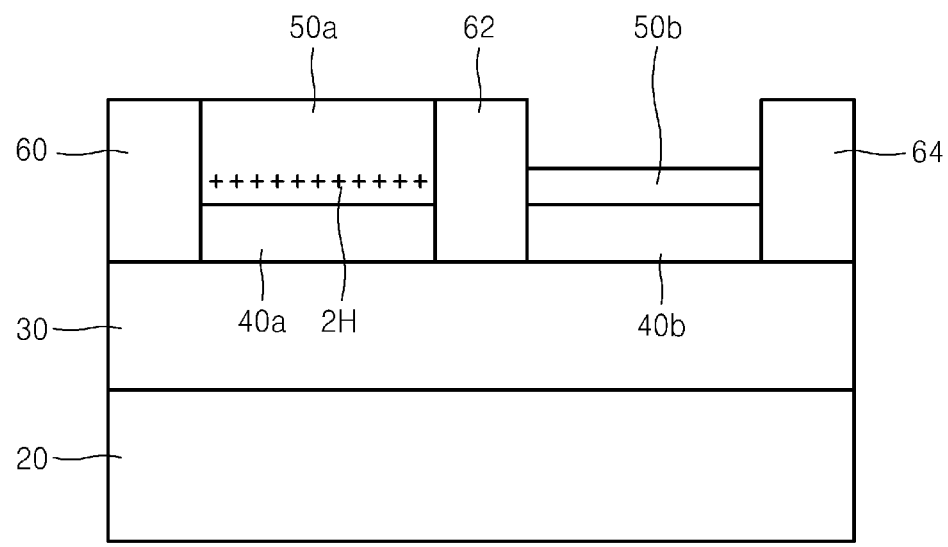

In order to obtain a resultant structure of FIG. 10, a thickness of the fourth compound semiconductor layer 50b is decreased. Here, the thickness of the fourth compound semiconductor layer 50b may be decreased until the 2DHG 2H disappears from the fourth compound semiconductor layer 50b. To decrease the thickness of the fourth compound semiconductor layer 50b, regions, excluding the fourth compound semiconductor layer 50b, are covered with a mask (a photosensitive film), and the mask is removed after the thickness of the fourth compound semiconductor layer 50b is decreased. The thickness of the fourth compound semiconductor layer 50b is decreased via a dry or wet method. When the wet method is used, an etchant having a higher etch selectivity with respect to the fourth compound semiconductor layer 50b than the first through third electrodes 60 through 64 may be used.

Figure 11:
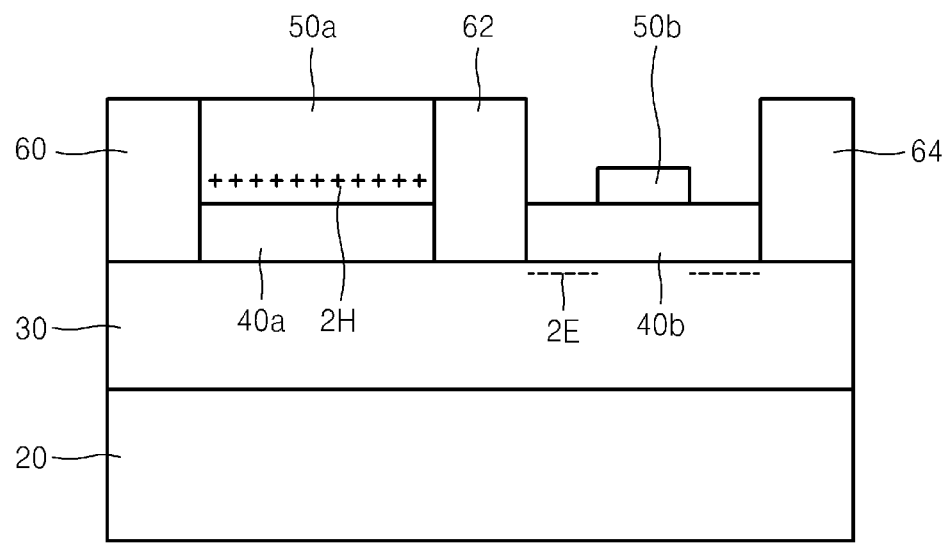

After decreasing the thickness of the fourth compound semiconductor layer 50b to be thinner than the thickness of the third compound semiconductor layer 50a, as shown in FIG. 10, part of the fourth compound semiconductor layer 50b is removed to only leave a part of the fourth compound semiconductor layer 50b so as to obtain the resultant structure of FIG. 11. A process of removing part of the fourth compound semiconductor layer 50b to only leave a part thereof may include a masking process for exposing a part of the fourth compound semiconductor layer 50b that is to be removed and an etching process for etching the exposed part of the fourth compound semiconductor layer 50b. The etching process may be performed until the second compound semiconductor layer 40b is exposed.

As a result, as shown in FIG. 11, only a part of the fourth compound semiconductor layer 50b is on a part of the second compound semiconductor layer 40b and is spaced apart from the second and third electrodes 62 and 64. Accordingly, the 2DEG 2E is shown in regions of the first compound semiconductor layer 30 between the second electrode 62 and the fourth compound semiconductor layer 50b and between the third electrode 64 and the fourth compound semiconductor layer 50b.

Figure 12:
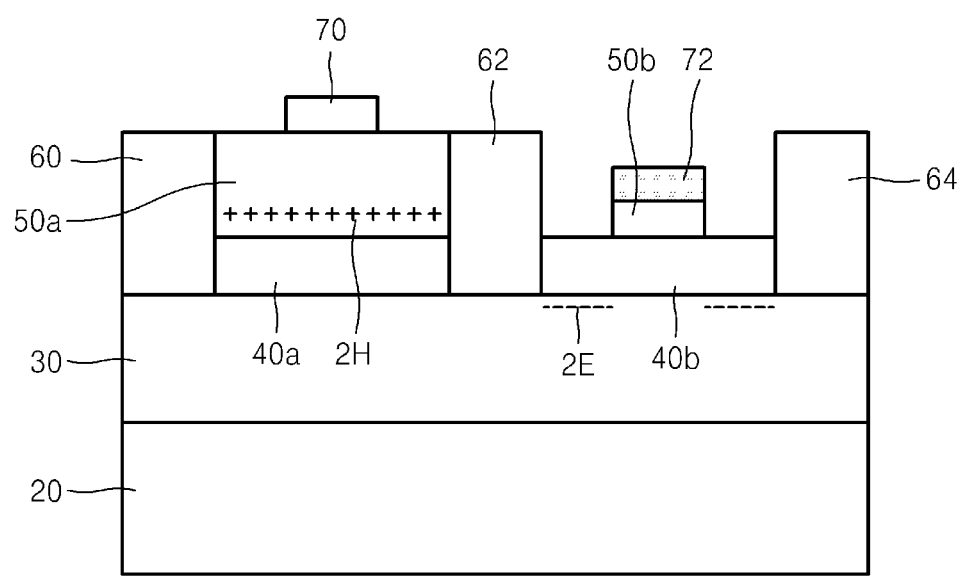

Referring to FIG. 12, the first gate electrode 70 may be formed on the third compound semiconductor layer 50a, and the second gate electrode 72 may be formed on the fourth compound semiconductor layer 50b. The first gate electrode 70 is spaced apart from the first and second electrodes 60 and 62. The first and second gate electrodes 70 and 72 may be formed via a lift-off method or via depositing, photographing, and etching processes of a gate electrode material.

Figure 13:
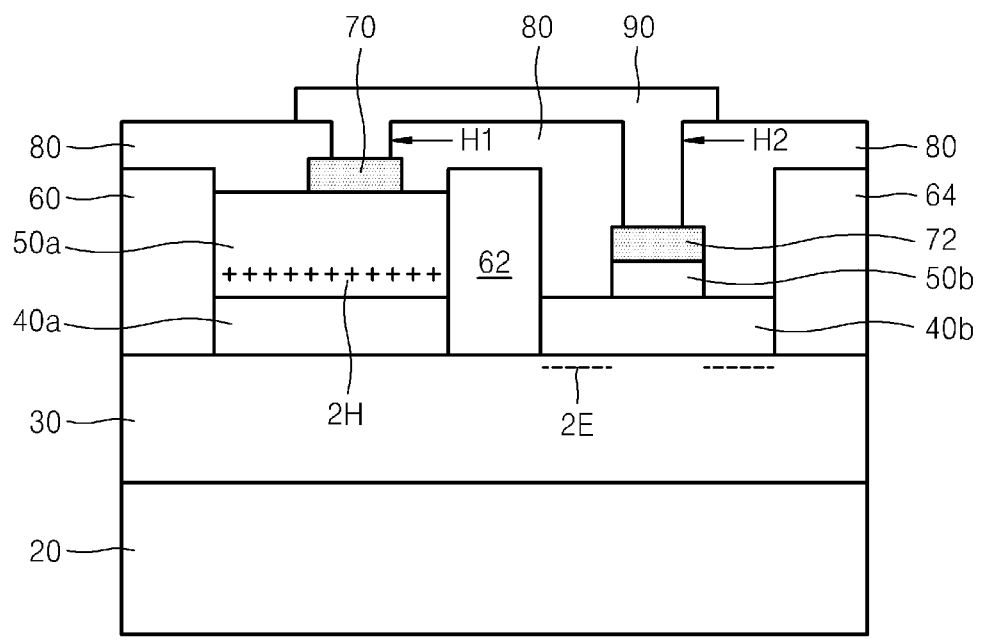

Referring to FIG. 13, the first and second gate electrodes 70 and 72, and the first interlayer insulation layer 80 covering edges of the first and second gate electrodes 70 and 72 are formed. The first and second contact holes H1 and H2 are formed in the first interlayer insulation layer 80. The first gate electrode 70 is partially exposed through the first contact hole H1. The second gate electrode 72 is partially exposed through the second contact hole H2. The first contact hole H1 may be formed with respect to the first gate electrode 70 and the second contact hole H2 may be formed with respect to the second gate electrode 72. The first wire 90 filling the first and second contact holes H1 and H2 may be formed on the first interlayer insulation layer 80. The first wire 90 is a common wire connected both to the first and second gate electrodes 70 and 72. The first wire 90 may be formed by forming a conductive film (not shown) filling the first and second contact holes H1 and H2 on the first interlayer insulation layer 80, and then patterning the conductive film.

As such, the semiconductor device using 2DEG and 2DHG, for example, a CMOS inverter, is formed according to example embodiments.

After the first wire 90 is formed in FIG. 13, the second interlayer insulation layer 94 covering the first wire 90 may be formed as shown in FIG. 4. The third contact hole H3 partially exposing the first electrode 60 and the fourth contact hole H4 partially exposing the third electrode 64 may be formed in the interlayer insulation layer consisting of the first and second interlayer insulation layers 80 and 94. The second wire 96 filing the third and fourth contact holes H3 and H4 may be formed on the second interlayer insulation layer 94.

As such, the semiconductor device controlling a bi-directional current flow, which uses an n-type FET as a main switch and a p-type FET as an FRD, may be formed.

Alternatively, although not illustrated, after the other compound semiconductor layer 50 is formed, the first through third electrodes 60 through 64 may be formed after decreasing a thickness of a region where an n-type FET is to be formed in the other compound semiconductor layer 50.

Alternatively, in order to obtain the resultant of FIG. 9, the first through third electrodes 60 through 64 may be first formed on the first compound semiconductor layer 30, and the second compound semiconductor layers 40a and 40b and the third and fourth compound semiconductor layers 50a and 50b may be grown on the first compound semiconductor layer 30 between the first through third electrodes 60 through 64. Subsequent processes may be performed as described above with reference to FIGS. 10 through 13.

As described above, according to example embodiments, a semiconductor device using 2DEG and 2DHG may have relatively high integration because both the p-type GaN switching device and an n-type GaN switching device are formed on one substrate. Because of the relatively high integration, the number of unnecessary wires may be reduced, and thus a parasitic component may be reduced. Also, by using 2DEG and 2DHG, not only a CMOS inverter, but also a power switching device may be formed, and thus the semiconductor device may be applied to the field of power devices.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A semiconductor device comprising:
a first compound semiconductor layer on a substrate;
first through third electrodes on the first compound semiconductor layer, the first through third electrodes spaced apart from each other and the first compound semiconductor layer between the second and third electrodes including a 2-dimensional electron gas (2DEG);
a second compound semiconductor layer on the first compound semiconductor layer between the first through third electrodes, the second compound semiconductor layer having a higher band gap than the first compound semiconductor layer;
a third compound semiconductor layer on the second compound semiconductor layer between the first and second electrodes, the third compound semiconductor layer including a 2-dimensional hole gas (2DHG);
a first gate electrode on the third compound semiconductor layer;
a fourth compound semiconductor layer on a part of the second compound semiconductor layer between the second and third electrodes, the fourth compound semiconductor layer having a smaller thickness than the third compound semiconductor layer; and
a second gate electrode on the fourth compound semiconductor layer, the second gate electrode connected to the first gate electrode through a first wire,
wherein all of the first through third electrodes are in direct contact with the first compound semiconductor layer, and
wherein the first compound semiconductor layer includes the 2DEG only between the second and third electrodes.

2. The semiconductor device of claim 1, further comprising:
a second wire connecting the first and third electrodes.

3. The semiconductor device of claim 1, wherein band gaps of the third and fourth compound semiconductor layers are smaller than the band gap of the second compound semiconductor layer.

4. The semiconductor device of claim 3, wherein the third and fourth compound semiconductor layers are formed of one of same and different compound semiconductors.

5. The semiconductor device of claim 3, wherein the third and fourth compound semiconductor layers include p-gallium nitride (GaN) layers.

6. The semiconductor device of claim 1, wherein the first compound semiconductor layer includes a Group III-V compound semiconductor layer.

* * * * *